United States Patent
Nguyen

(10) Patent No.: US 9,837,800 B2
(45) Date of Patent: Dec. 5, 2017

(54) MOUNTING OF A START SYSTEM ON A PLURALITY OF SECURING RAILS

(71) Applicant: ABB TECHNOLOGY AG, Zurich (CH)

(72) Inventor: Eric Nguyen, Saint Etienne (FR)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 14/791,215

(22) Filed: Jul. 2, 2015

(65) Prior Publication Data

US 2016/0006221 A1  Jan. 7, 2016

(30) Foreign Application Priority Data

Jul. 3, 2014 (FR) ...................................... 14 56361

(51) Int. Cl.
*H02B 1/052* (2006.01)
*H02B 1/04* (2006.01)
*H01H 89/06* (2006.01)

(52) U.S. Cl.
CPC ........... *H02B 1/0523* (2013.01); *H01H 89/06* (2013.01); *H02B 1/041* (2013.01)

(58) Field of Classification Search
CPC .... H02B 1/052–1/0526; H05K 7/1474; H01R 9/2608
See application file for complete search history.

(56) References Cited

U.S. PATENT DOCUMENTS

| 4,671,697 A * | 6/1987 | Ando | H02B 1/052 403/325 |
| 6,292,076 B1 * | 9/2001 | DeGrazia | H02B 1/052 335/202 |
| 6,790,058 B2 * | 9/2004 | Schlieber | H02B 1/0565 439/110 |
| 7,446,635 B2 * | 11/2008 | Stanke | H01R 9/2675 200/50.32 |

(Continued)

FOREIGN PATENT DOCUMENTS

| DE | 3136545 A1 * | 4/1983 | ............. H02B 1/052 |
| DE | 3248124 A1 | 7/1984 | |

(Continued)

*Primary Examiner* — Robert J Hoffberg
(74) *Attorney, Agent, or Firm* — Cantor Colburn LLP

(57) ABSTRACT

The present invention relates to a start system (1) comprising a plurality of electrical apparatuses (3, 5) each comprising an insulating casing (7, 9), secured to each other and having an alignment along a first extension direction (D1). The plurality of electrical apparatuses (3, 5) is intended to be brought on a plurality of securing rails (13, 15) extending along a second extension direction (D2) transversal to the first extension direction (D1). A first electrical apparatus (3) comprises a removable mounting device (21) including a primary movable mounting element (17), the mounting device (21) forming a primary housing (35) in which a portion (13*a*) of a first rail (13) is able to be inserted. A second electrical apparatus (5) comprises a secondary mounting element (19), the secondary mounting element (19) forming, with the insulating casing (9) of the second (Continued)

electrical apparatus (5) a secondary housing (81) in which is able to be inserted a portion (15*a*) of a second rail (15).

13 Claims, 4 Drawing Sheets

(56) References Cited

U.S. PATENT DOCUMENTS

| | | | | |
|---|---|---|---|---|
| 7,674,129 | B1 * | 3/2010 | Liu | H02B 1/052 |
| | | | | 361/807 |
| 8,647,158 | B2 * | 2/2014 | Kawabata | H01R 9/2608 |
| | | | | 439/716 |
| 2011/0269339 | A1 * | 11/2011 | Baran | H05K 7/1474 |
| | | | | 439/532 |

FOREIGN PATENT DOCUMENTS

| | | | | | |
|---|---|---|---|---|---|
| DE | 9202815 | U1 | * | 7/1993 | ............ H01R 9/2608 |
| DE | EP 1480307 | A1 | * | 11/2004 | ............ H02B 1/052 |
| DE | 102011010828 | A1 | * | 8/2012 | ............ H02B 1/052 |
| EP | 0198265 | A2 | | 10/1986 | |
| EP | 2498353 | A1 | | 9/2012 | |
| ES | 2076075 | A2 | | 10/1995 | |
| FR | 2837617 | A1 | | 9/2003 | |
| IN | 660DE2012 | | * | 8/2015 | ............ H02B 1/052 |
| JP | 06223926 | A | * | 8/1994 | |

* cited by examiner

MOUNTING OF A START SYSTEM ON A PLURALITY OF SECURING RAILS

CROSS REFERENCE TO RELATED APPLICATION

This application is related to and claims the benefit of French Application Number 14/56361 filed on 3 Jul. 2014, the contents of which are herein incorporated by reference in their entirety.

TECHNICAL FIELD

The present invention relates to a device for mounting a start system on a plurality of rails.

BACKGROUND

A start system is composed of a contactor and a circuit breaker. These electrical apparatuses are generally added independently on rails, allowing their installation in an electrical cabinet. However, these electrical apparatuses are intended to operate together, it is hence more suitable to secure them in a pre-assembled manner on rails. It is known to use standard securing devices, that is to say formed of two hooked mounting elements, opposite each other, for independently securing the electrical apparatuses. Securing the pre-assembled start system on two securing rails is not possible. The securing rails being disposed on a same first plane and the securing devices being secured on a same second plane, it is not possible to simultaneously insert one edge of a first securing rail and one edge of a second securing rail in the housings formed by the hooked mounting elements.

It is known to use additional securing plates in order to bring the start system on the securing rails, thus increasing the size of the system, and implying a higher manufacturing cost.

BRIEF SUMMARY

The purpose of the present invention is to resolve all or part of the aforementioned drawbacks.

To this end, the present invention relates to a device for mounting a first electrical apparatus intended to collaborate with a second electrical apparatus in such a manner as to form, in an assembled state, a start system intended to be brought on a plurality of securing rails, the mounting device comprising:
- a support intended to be brought on the first electrical apparatus of the start system and comprising at least one guiding element;
- a mounting element capable of occupying a retracted position and a deployed position, arranged to be guided between the retracted position and the deployed position by at least one guiding element;
- a return element arranged for returning the mounting element towards the deployed position, in deployed position, the mounting element forms a housing with the support in which is intended to be inserted a first portion of a securing rail from among the plurality of securing rails by defining a relative securing position of said securing rail with respect to the first electrical apparatus in the assembled state.

The first portion of the rail may in particular be constituted by a first edge of said rail.

Thanks to the dispositions according to the invention, adding a mounting device allows mounting a pre-assembled start system on the rails. With the insulating casings maintaining their standard dimensions, the possibility, optionally, for the electrical apparatuses to be mounted independently from each other on rails is maintained.

The dispositions according to the invention further allow securing the start system by first inserting a portion of a first securing rail in the housing formed by a stationary mounting element, then second by positioning a portion of the second rail when the moveable mounting element is maintained in retracted position. Finally, the moveable mounting element is released and returned to deployed position and the portion of the second rail is thus retained.

According to optional features of the mounting device according to the invention:
- the mounting element comprises a gripping portion;
- the support comprises a locking element intended to collaborate with the first electrical apparatus;
- the locking element comprises a pressing portion intended to collaborate with the first electrical apparatus;
- the support comprises an elastic element comprising a bearing portion intended to collaborate with the first electrical apparatus;
- the elastic element comprises a planar portion and an opening.

The present invention also relates to an electrical apparatus intended to be brought on a plurality of securing rails, the electrical apparatus being intended to be mounted and electrically coupled with a second electrical apparatus in such a manner as to form a start system and comprising:
- an insulating casing;
- a mounting device compliant with any one of the aforementioned features, secured to the insulating casing;
- the insulating casing comprising a pressing area intended to collaborate with a second portion of a securing rail disposed according to the relative securing position with respect to the electrical apparatus in the assembled state.

Particularly the second portion of the rail corresponds to the second edge of the rail opposite the first edge forming the first portion.

According to an aspect of the invention, the insulating casing comprises:
- a retaining housing comprising an inserting portion for inserting the locking element of the mounting device and a pressing part against which the locking element of the mounting device is in abutment;
- a maintaining element arranged to collaborate with the bearing portion of the elastic element of the mounting device.

According to an aspect of the invention, the electrical apparatus comprises an individual securing device comprising:
- a first individual mounting element being stationary and forming with the insulating casing a first housing in which is intended to be inserted a first portion of a securing rail by defining a relative individual securing position of said securing rail with respect to the electrical apparatus;
- a second individual mounting element moveable between a retracted position and a deployed position, and forming with the insulating casing a second housing when it occupies the deployed position, in which is intended to be inserted a second portion of a securing rail disposed according to the relative individual securing position of said securing rail with respect to the electrical apparatus.

According to an aspect of the invention, the first mounting element and the second mounting element are oriented in an opposite manner.

According to an aspect of the invention, the first mounting element is integral with the insulating casing.

According to an aspect of the invention, the securing device comprises pressing housing defined between the first individual mounting element and the second individual mounting element forming the pressing area.

The present invention also relates to a start system intended to be brought on a plurality of securing rails comprising:
- a first electrical apparatus compliant with any one of the aforementioned features;
- a second electrical apparatus mounted with the first electrical apparatus and electrically connected to the first electrical apparatus, the first electrical apparatus and the second electrical apparatus being aligned along a first extension direction, the first electrical apparatus being intended to collaborate with a first securing rail from among the plurality of securing rails, disposed in the relative securing position with respect to the first electrical apparatus in the assembled state, the first securing rail extending along a second extension direction transversal to the first extension direction, the second electrical apparatus being intended to collaborate with a second securing rail, in a relative securing position with respect to the second electrical apparatus in the assembled state, the second securing rail extending along the second extension direction, and being shifted with respect to the first securing rail.

An extension direction transversal to the first extension direction means an extension direction oriented according to an angle between 60° and 120° with respect to the first extension direction.

Preferably, the second extension direction is oriented according to an angle between 70° and 110° with respect to the first extension direction.

Preferably, the second extension direction is oriented according to an angle between 80° and 100° with respect to the first extension direction.

Preferably, the second extension direction is perpendicular to the first extension direction.

According to an aspect of the invention, the second electrical apparatus comprises a second insulating casing, the insulating casing of the first electrical apparatus being called first insulating casing, the second electrical apparatus comprising, in complement with the mounting element of the first electrical apparatus in the assembled state, called primary mounting element a secondary mounting element being stationary in the assembled state forming with the second insulating casing a secondary housing in complement with the housing formed by the primary mounting element and the first insulating casing, called primary housing, the secondary housing being intended to receive a first portion of the second securing rail in the relative securing position of the second securing rail with respect to the second electrical apparatus in the assembled state, the second insulating casing comprising a second pressing area by similarity with the pressing area of the first insulating casing, called first pressing area, at which a second portion of the second securing rail is intended to press on in the relative securing position of the second support rail with respect to the second electrical apparatus in the assembled state.

According to an aspect of the invention, the secondary mounting element is integral with the second insulating casing.

According to an aspect of the invention, the second electrical apparatus comprises a second individual securing device, the individual securing device of the first electrical apparatus called first securing device the second securing device comprising:
- a third individual mounting element moveable between a retracted position and a deployed position, and forming with the second insulting casing a third housing when it occupies the deployed position, in which is intended to be inserted the first portion of a securing rail in a relative individual securing position of said securing rail with respect to the second electrical apparatus;
- a fourth stationary individual mounting element forming with the second insulating casing a fourth housing in which is intended to be inserted the second portion of the securing rail disposed in the relative individual securing position of said securing rail with respect to the second electrical apparatus.

According to an aspect of the invention, the third mounting element and the fourth mounting element are oriented in an opposite manner.

According to an aspect of the invention, the fourth mounting element is integral with the second insulating casing.

According to an aspect of the invention, the second securing device comprises a second pressing housing, the pressing housing of the first securing device called first pressing housing, the second pressing housing being defined between the third mounting element and the fourth mounting element forming the second pressing area.

According to an aspect of the invention, the start system comprises a device for securing the start system, intended to secure the start system on two securing rails comprising:
- the primary mounting element intended to collaborate with the first portion of the first securing rail in the first relative position of the first securing rail with respect to the first electrical apparatus;
- the secondary mounting element intended to cooperate with the first portion of the second securing rail in the first relative position of the second securing rail with respect to the second electrical apparatus.

According to an aspect of the invention, the device for securing the start system comprises:
- the first pressing area intended to collaborate with the second portion of the first securing rail in the first relative position of the first securing rail with respect to the first electrical apparatus;
- the second pressing area of the second electrical apparatus intended to collaborate with the second portion of the second securing rail in the first relative position of the second securing rail with respect to the second electrical apparatus.

BRIEF DESCRIPTION OF THE DRAWINGS

Other features and advantages of the present invention will become apparent in light of the following description and by examining the accompanying drawings, in which.

On this set of figures, identical or similar references designate identical or similar members or assemblies of members.

DETAILED DESCRIPTION

Figure 1:
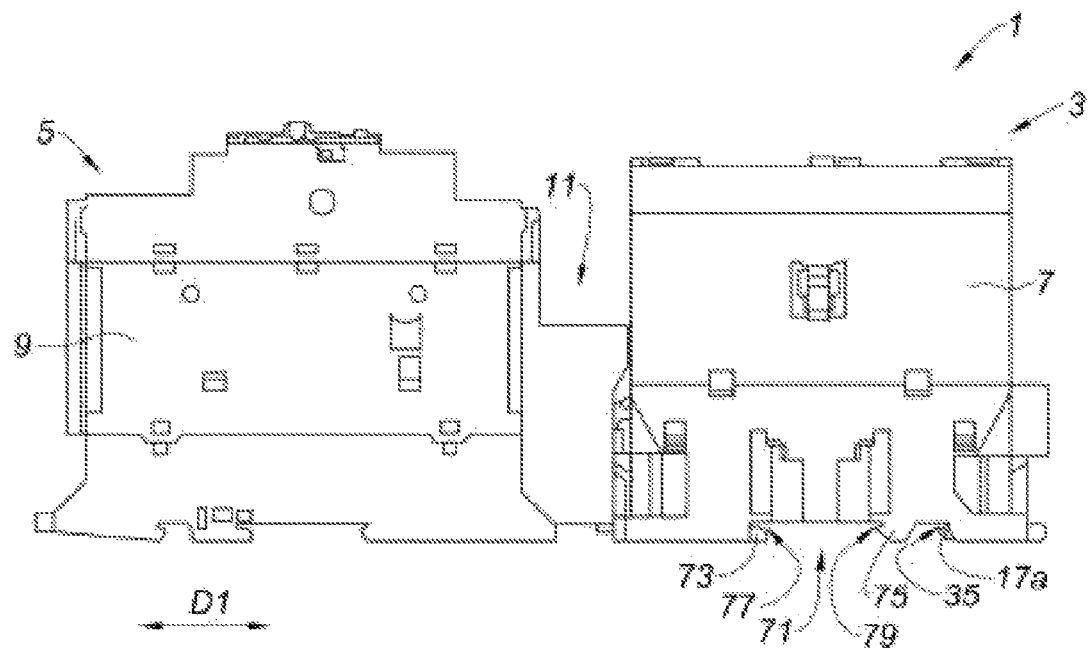
FIG. 1 represents a contactor and a circuit breaker forming, in the assembled state, a start system.

FIG. 1 represents a start system 1 comprising a contactor 3 and a circuit breaker 5. The contactor 3 and circuit breaker 5 each comprise an electrically insulating casing 7, 9 allowing to protect their electrical components from the outside environment. The contactor 3 and the circuit breaker 5 are electrically connected and secured by a connecting element 11. The contactor 3 and circuit breaker 5 are aligned along a first extension direction D1.

Figure 2:
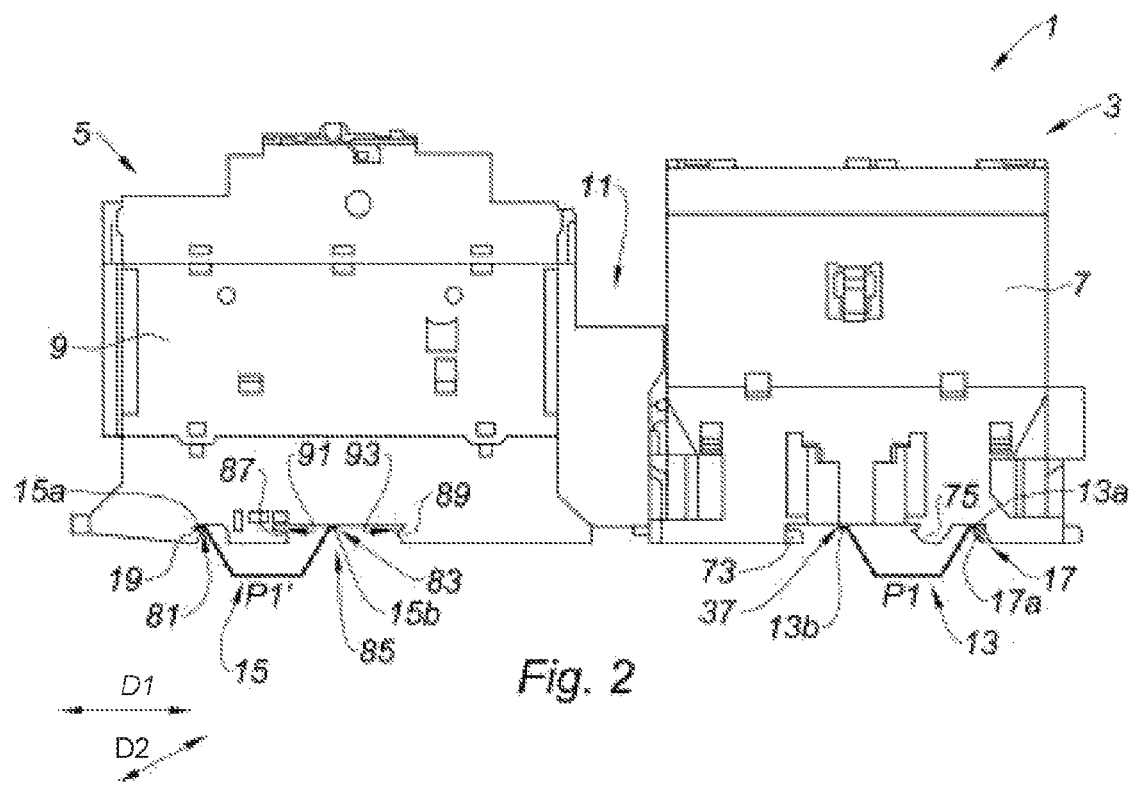
FIG. 2 represents a contactor and a circuit breaker forming, in the assembled state, a start system brought on two rails.

As represented on FIG. 2, the start system 1 is brought on two rails 13, 15 of DIN type within an electric casing. The rails 13, 15 extend along a second extension direction D2, substantially perpendicular to the first extension direction D1. The rails 13 and 15 extend facing each other and are shifted with respect to each other. In order to be able to secure the assembly of the start system 1 on the rails 13, 15, a mounting element 17 is brought on the contactor 3 and a mounting element 19 is brought on the circuit breaker 5. In fact, the mounting elements 17 and 19 form a device for securing the start system, and are intended to operate together. When the start system is secured on the rails 13 and 15, the rail 13 is in a relative securing position P1 with respect to the contactor 3 in the assembled state and the rail 15 is in a relative securing position P1' with respect to the circuit breaker 5 in the assembled state.

Figure 3:
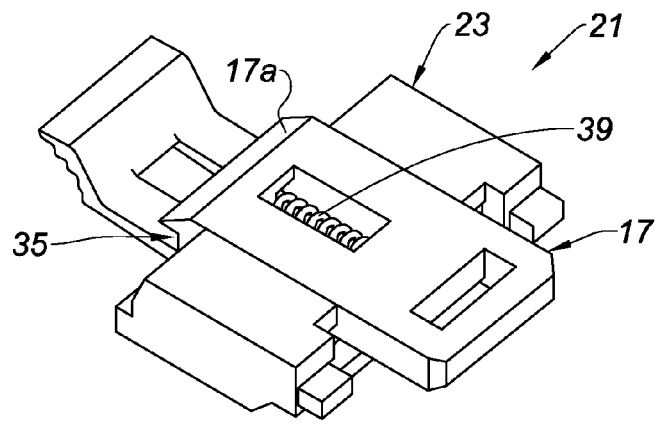
FIG. 3 represents a device for mounting the contactor in the assembled state.
Figure 4A:
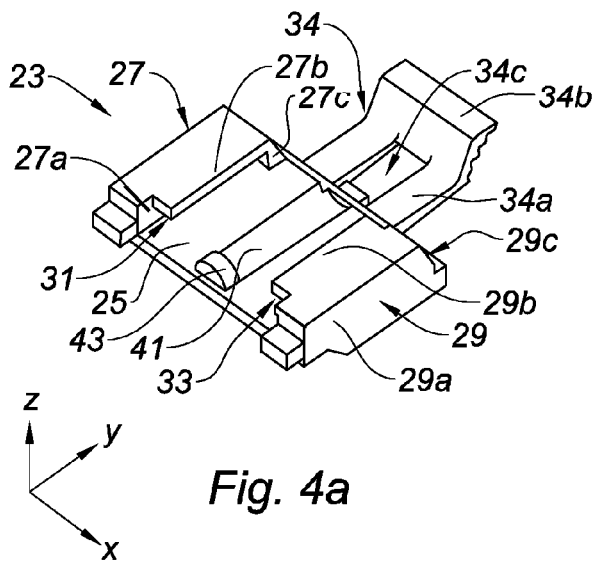
FIGS. 4a and 4b represent a support of a mounting device.
Figure 4B:
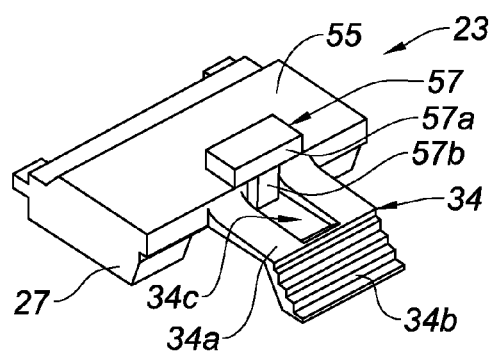

A mounting device 21 is represented on FIG. 3. The mounting device 21 comprises the mounting element 17. The mounting device 21 also comprises a support 23 represented on FIGS. 4a and 4b. The support 23 comprises a surface 25 and two guiding elements 27, 29. The guiding element 27 comprises a bearing element 27a along a direction –x, a bearing element 27b along a direction z and a bearing element 27c along a direction y. A housing 31 is defined between the guiding element 27 and the surface 25. The guiding element 29 comprises a bearing element 29a along a direction x, a bearing element 29b along a direction z and a bearing element 29c along a direction y. A housing 33 is defined between the guiding element 29 and the surface 25.

Figure 5A:
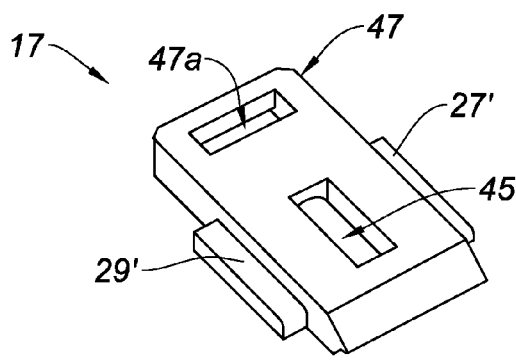
FIGS. 5a and 5b represent a mounting element of a mounting device.
Figure 5B:
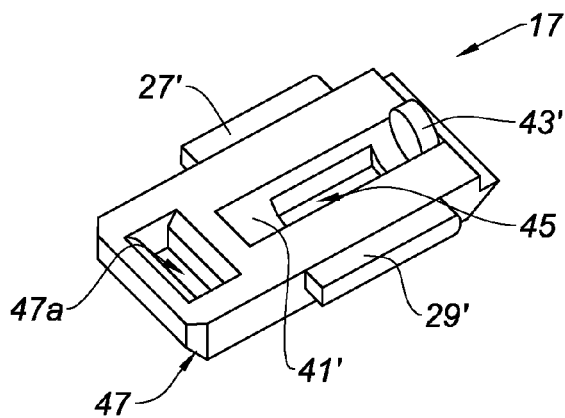
Figures 6A, 6B, 6C, 6D:
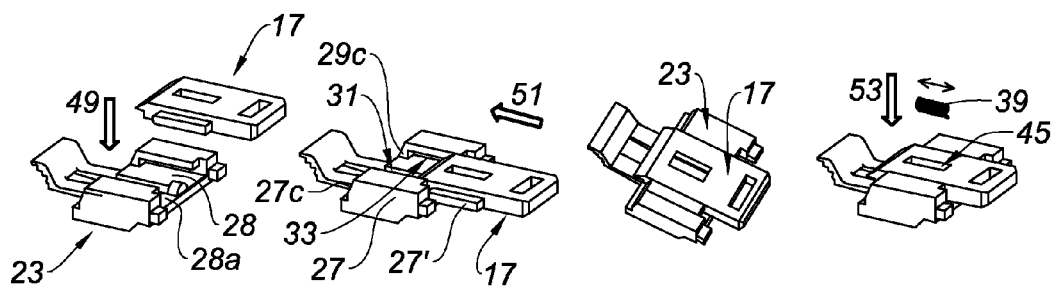
FIGS. 6a, 6b, 6c, 6d represent the steps for mounting a mounting device.

The mounting element 17, represented on FIGS. 5a and 5b, is intended to press on the surface 25, and be inserted in the housings 31 and 33.

The mounting element 17 comprises guiding elements 27' and 29'. The guiding element 27' is intended to press on the bearing elements 27a, 27b, 27c of the guiding element 27 and the guiding element 29' is intended to press on the bearing elements 29a, 29b, 29c of the guiding element 29.

The support 23 also comprises an elastic element 34, intended to collaborate with the insulating casing 7 of the contactor 3, comprising a planar portion 34a and a bearing element 34b and a housing 34c.

The mounting element 17 is moveable between a retracted position and a deployed position. In deployed position, represented on FIGS. 1, 2 and 3, a housing 35 is defined between the end portion 17a of the mounting element 17 and the planar portion 34a of the elastic element 34 of the support 23. An edge 13a of the rail 13 is intended to be inserted in the housing 35. The other edge 13b of the rail 13 is intended to press on the insulting casing 7 at a pressing area 37.

A return element, here a spring 39 allows returning the mounting element 17 from the retracted position towards the deployed position. The support 23 comprises a semi-circular housing 41 arranged for accommodating the spring 39 and a abutment 43 against which a first end of the spring 39 is intended to press on. The mounting element 17 comprises a semi-circular housing 41', intended to be disposed facing the semi-circular housing 41 of the support 23, and arranged for accommodating the spring 39. The mounting element 17 further comprises a abutment 43' against which is intended to press a second end of the spring 39. The abutment 43' is intended to be disposed facing the abutment 43 of the support 23. The mounting element 17 comprises a insertion opening 57 of the spring 39. The mounting element 17 comprises a gripping element 47 comprising an opening 47a in order to allow manually displacing the mounting element 17 from the deployed position towards the refracted position.

The steps of mounting the mounting element 17 on the support 23 are represented on FIGS. 6a, 6b, 6c and 6d. In a first step represented on FIG. 6a, the mounting element 17 is placed, along a direction represented by the arrow 49, at the edge 28a of the surface 28 of the support 23. In a second step represented on FIG. 6b, the mounting element 17 is slidably inserted in the housings 31 and 33, along a direction represented by the arrow 51, until the guiding element 27' presses on the bearing element 27c and the guiding element 29' presses on the bearing element 29c. As represented on FIG. 6c, the mounting element 17 is then in deployed position. In the deployed position, the semi-circular housing 41' is disposed facing the semi-circular housing 41 and the abutment 43' is disposed facing the abutment 43. In a last step represented on FIG. 6d, the spring 39 is compressed then inserted in the semi-circular housings 41, 41' by means of the insertion opening 45, along a direction represented by the arrow 53. The spring 39 then expands in order to press on the abutment 43 and 43'.

The support 23 also comprises a surface 55 opposite the surface 25 and a locking element 57 having a substantially similar shape to the letter "T". The locking element 57 comprises a pressing portion 57a and a sliding portion 57b, intended to collaborate with the insulating casing 7 of the contactor 3.

Figure 7:
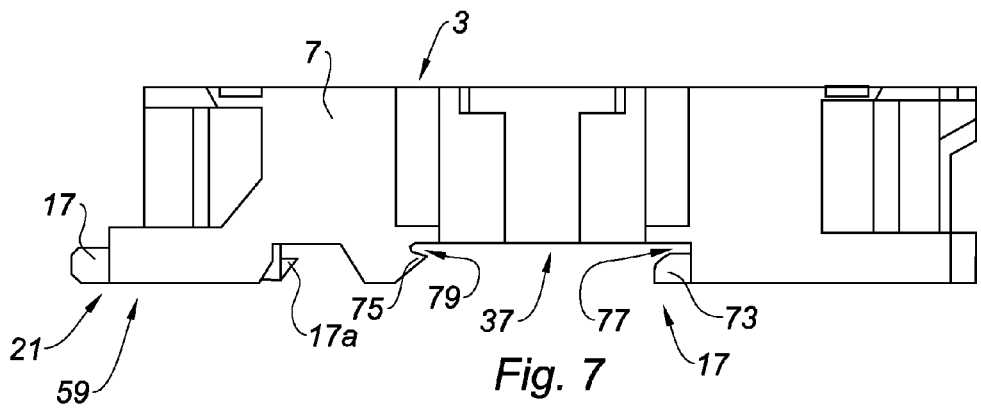
FIG. 7 represents a contactor on which a mounting device is mounted.

The mounting device 21 is intended to be mounted on an edge 59 of the contactor 3 as represented on FIG. 7.

Figures 8A, 8B, 8C:
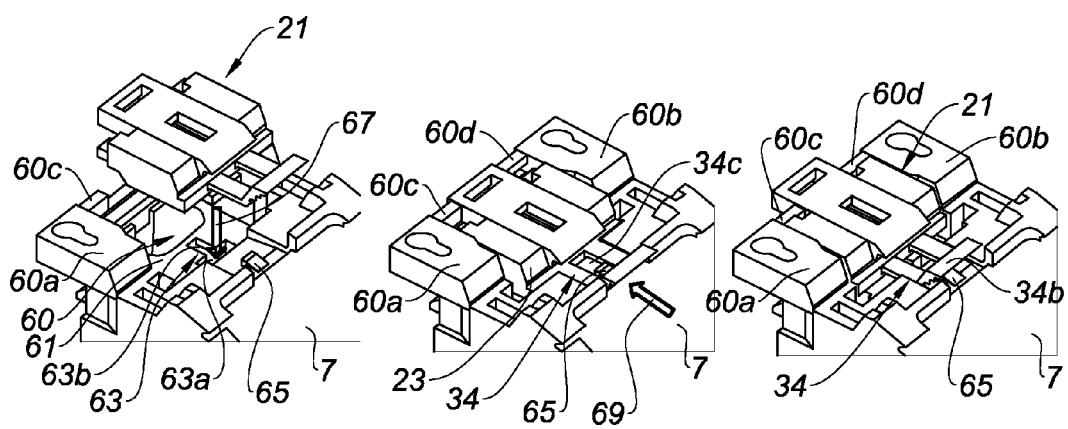
FIGS. 8a, 8b and 8c represent the steps of mounting a mounting device on a contactor.

The steps of mounting the mounting device 21 on the contactor 3 are represented on FIGS. 8a, 8b and 8c.

As represented on FIG. 8a, the insulating casing 7 comprises a location 60 intended to receive the mounting device 21. The location 60 is delimited by two guiding elements 60a and 60b, opposite each other, by two bearing elements 60c and 60d, by a surface 61 and by a protruding maintaining element 65. The insulating casing 7 comprises a retaining housing 63 at the location 60, comprising an insertion portion 63a and a pressing part 63b.

During a first step, the mounting device 21 is placed in the location 60, along a direction represented by the arrow 67 on FIG. 8a, in such a manner that the surface 55 of the support 23 presses on the surface 61 of the insulating casing 7, and in such a manner that the locking element 57 is positioned facing the insertion portion 63a of the housing 63. The locking element 57 is inserted in the insertion portion 63a of the housing 63 until the surface 55 presses against the surface 61. As represented on FIG. 8b, the mounting device 21 then presses on the guiding elements 60a and 60b and the maintaining element 65 is disposed in the housing 34c of the elastic element 34 of the support 23.

During a second step, the mounting device 21 is displaced along a direction represented by the arrow 69 on FIG. 8b. The mounting device 21 slides between the guiding elements 60a and 60b and the sliding portion 57b of the locking element 57 slides in the pressing part 63b of the housing 63, until the mounting device 21 presses on the bearing elements 60c and 60d of the insulating casing 7. The translation movements along the direction y of the mounting device 21 with respect to the insulating casing 7 are thus locked. The pressing portion 57a of the locking element 57 is in abutment with the pressing part 63b of the housing 63 and locks the translation movements of the mounting device 21 with respect to the insulating casing 7 along the direction z. During this displacement of the protective device along arrow 69, the elastic element 34 is manually lifted along the direction z. When the mounting device presses on the bearing portions 60c and 60d, the elastic element 34 is released. The bearing element 34b thus faces the maintaining element 65, and locks the translation movements of the mounting device 21 with respect to the insulating casing 7 along the direction −y.

Figure 9A:
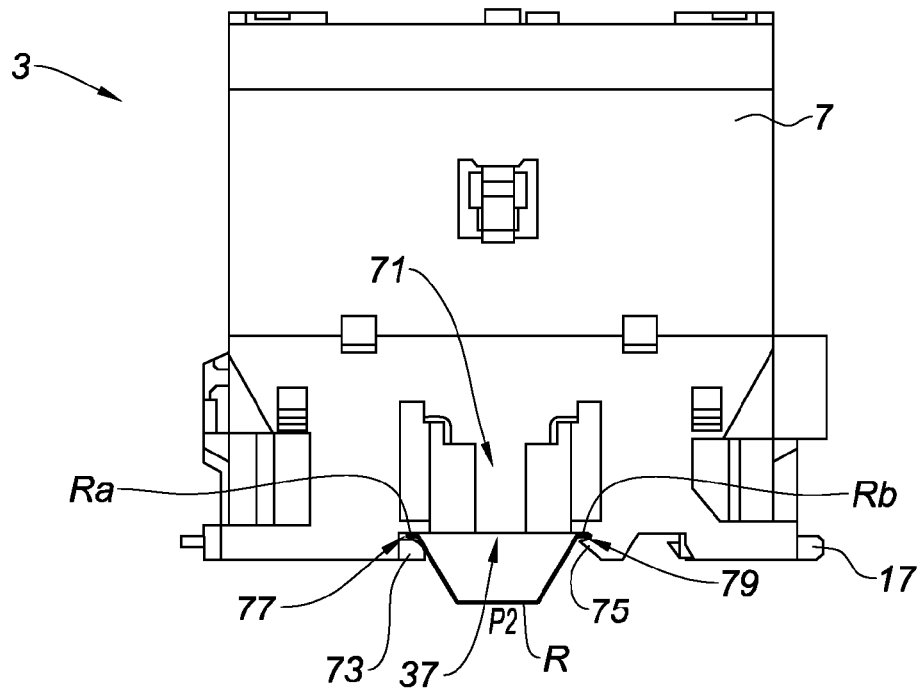
FIG. 9a represents a contactor brought in an individual manner on a rail.

The contactor 3 further comprises a securing device 71 represented on FIG. 9a. The securing device 71 allows independently securing the contactor 3 on a rail R, that is to say when it is not secured to a circuit breaker. The rail R is thus disposed in a relative individual position P2 with respect to the contactor 5. The securing device 71 is constituted of two mounting elements 73 and 75.

The mounting element 73 is moveable between a retracted position and a deployed position. In deployed position, the mounting element 73 and the insulating casing 7 define a housing 77 in which is intended to be inserted a first edge Ra of the rail R.

The mounting element 75 is stationary and integral with the insulating casing 7. The mounting element 75 and the insulating casing 7 define a housing 79 in which is intended to be inserted a second edge Rb of the rail R.

The mounting elements 73 and 75 of the securing device 71 define a housing, forming the pressing area 37 of the second edge 13b of the rail 13.

As represented on FIG. 1, the mounting element 19 of the circuit breaker 5 is integral with the insulating casing 9 and is stationary with respect to the insulating casing 9. A housing 81 is defined between the mounting element 19 and the insulating casing 9. A first edge 15a of the rail 15 is intended to be inserted in the housing 81. A second edge 15b of the rail 15 is intended to press on the insulating casing 9 at a pressing area 83. The rail 15 is then disposed in the relative securing position P1' with respect to the circuit breaker 5 in the assembled state.

Figure 9B:
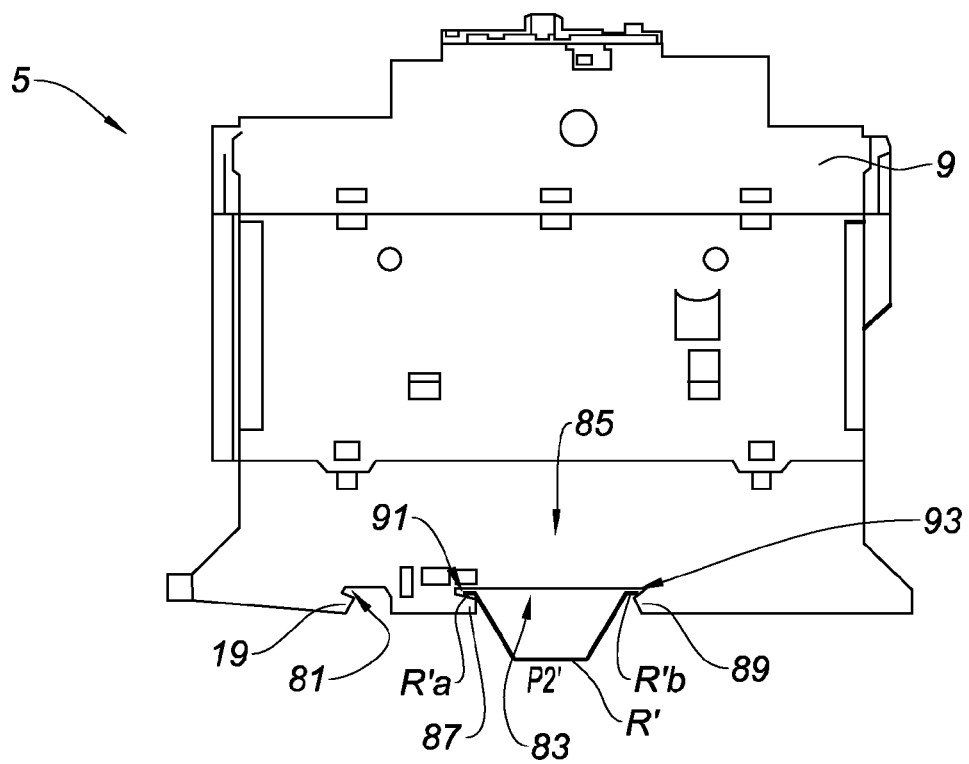
FIG. 9b represents a circuit breaker brought in an individual manner on a rail.

The circuit breaker 5 further comprises a securing device 85 represented on FIG. 9b. The securing device 85 allows independently securing the circuit breaker 5 on a rail R', that is to say, when it is not secured to a contactor. The rail R' is thus disposed in a relative individual position P2' with respect to the circuit breaker 5. The securing device 85 is constituted of two mounting elements 87 and 89.

The mounting element 87 is moveable between a retracted position and a deployed position. In deployed position, the mounting element 87 and the insulating casing 9 define a housing 91 in which is intended to be inserted a first edge R'a of the rail R'.

The mounting element 89 is integral with the insulating casing 9 and stationary with respect to the insulating casing 9. The mounting element 89 and the insulating casing 9 define a housing 93 in which is intended to be inserted a second edge R'b of the rail R'.

The mounting elements 87 and 89 of the securing device 85 define a housing, forming the pressing area 83 of the second edge 15b of the rail 15.

The device for securing the start system 1 on the rails 13 and 15 comprises, in addition to the mounting elements 17 and 19, pressing areas 37 and 83 collaborating with the second portions 13b and 15b of the rails 13 and 15 respectively.

Obviously, the present invention is not limited to the described and represented embodiment, provided by way of illustrating and non limiting example.

For example, the removable mounting device may be brought on the circuit breaker in a similar manner.

According to an embodiment, the mounting device may be formed of a block, an operator not being able to dismantle it.

According to another embodiment, the mounting device may be secured on an insulating casing of an electrical apparatus in a permanent manner.

The invention claimed is:

1. A start system intended to be brought on a plurality of securing rails, the start system comprising a first electrical apparatus being intended to collaborate with a first securing rail from among the plurality of securing rails, and a second electrical apparatus being intended to collaborate with a second securing rail from among the plurality of securing rails and intended to be mounted with the first electrical apparatus and electrically connected to the first electrical apparatus in such a manner as to form the start system, the first electrical apparatus and the second electrical apparatus being aligned along a first extension direction (D1),
the first electrical apparatus comprising a first insulating casing and a mounting device secured to the first insulating casing, the mounting device comprising:
a support intended to be brought on the first electrical apparatus of the start system and comprising at least one guiding element,
a primary mounting element capable of occupying a retracted position and a deployed position in which the primary mounting element forms a primary housing with the support in which is intended to be inserted a first portion of the first securing rail by defining a first relative securing position (P1) of the first securing rail with respect to the first electrical apparatus, the primary mounting element being arranged to be guided between the retracted position and the deployed position by said at least one guiding element, and
a return element arranged for returning the primary mounting element towards the deployed position,
the first insulating casing comprising a first pressing area intended to collaborate with a second portion of the first securing rail when the first securing rail is disposed according to the first relative securing position (P1) with respect to the first electrical apparatus, the first securing rail extending along a second extension direction (D2) transversal to the first extension direction (D1) when the first securing rail is disposed in the first relative securing position (P1) of the first securing rail with respect to the first electrical apparatus, and the second securing rail being in a first relative securing position (P1') of the second securing rail with respect to the second electrical apparatus when the second electrical apparatus is mounted with the first electrical apparatus and the first securing rail is in the first relative securing position (P1), in which the second securing rail is extending along the second extension direction (D2) and is shifted in the first extension direction (D1) with respect to the first securing rail.

2. The start system according to claim 1, wherein the support comprises a locking element comprising a pressing portion intended to collaborate with the first electrical apparatus.

3. The start system according to claim 2, wherein the support comprises an elastic element comprising a bearing portion intended to collaborate with the first electrical apparatus.

4. The start system according to claim 3, wherein the elastic element comprises a planar portion and an opening.

5. The start system according to claim 3, wherein the first insulating casing comprises:
   a retaining housing comprising an inserting portion for inserting the locking element of the mounting device and a pressing part against which the locking element of the mounting device is in abutment, and
   a maintaining element arranged to collaborate with the bearing portion of the elastic element of the mounting device.

6. The start system according to claim 1, wherein the primary mounting element comprises a gripping portion.

7. The start system according to claim 1, wherein the first electrical apparatus further comprises a first individual securing device comprising:
   a first individual mounting element being stationary and forming with the first insulating casing, a first housing in which is intended to be inserted the first portion of the first securing rail by defining a second relative securing position (P2) of said first securing rail with respect to the first electrical apparatus, and
   a second individual mounting element moveable between a retracted position and a deployed position, and forming with the first insulating casing, a second housing when the second individual mounting element occupies its deployed position, in which is intended to be inserted the second portion of the first securing rail when the first securing rail is disposed according to the second relative securing position (P2) of said first securing rail with respect to the first electrical apparatus.

8. The start system according to claim 7, wherein the first individual securing device comprises a first pressing housing defined between the first individual mounting element and the second individual mounting element, forming the first pressing area.

9. The start system according to claim 7, wherein the second electrical apparatus comprises a second individual securing device comprising:
   a third individual mounting element moveable between a retracted position and a deployed position, and forming with the second insulating casing a third housing when the third individual mounting element occupies its deployed position, in which is intended to be inserted a first portion of the second securing rail in a second relative securing position (P2') of said second securing rail with respect to the second electrical apparatus, and
   a fourth individual mounting element forming with the second insulating casing a fourth housing in which is intended to be inserted a second portion of the second securing rail disposed in the second relative securing position (P2') of said second securing rail with respect to the second electrical apparatus.

10. The start system according to claim 1, wherein the second extension direction (D2) is oriented according to an angle between 60° and 120° with respect to the first extension direction (D1).

11. The start system according to claim 1, wherein the second electrical apparatus comprises a second insulating casing and, in complement with the primary mounting element of the first electrical apparatus when the second electrical apparatus is mounted with the first electrical apparatus and the first securing rail is in the first relative securing position (P1), a secondary mounting element being stationary and forming with the second insulating casing a secondary housing in complement with the primary housing formed by the primary mounting element and the support,
   the secondary housing being intended to receive a first portion of the second securing rail in the first relative securing position (P1') of the second securing rail with respect to the second electrical apparatus, and
   the second insulating casing comprising a second pressing area by similarity with the first pressing area of the first insulating casing, at which a second portion of the second securing rail is intended to press on in the first relative securing position (P1') of the second securing rail with respect to the second electrical apparatus.

12. The start system according to claim 11, wherein the second electrical apparatus further comprises a second individual securing device comprising:
   a third individual mounting element moveable between a retracted position and a deployed position, and forming with the second insulating casing a third housing when the third individual mounting element occupies its deployed position, in which is intended to be inserted the first portion of the second securing rail in a second relative securing position (P2') of said second securing rail with respect to the second electrical apparatus, and
   a fourth individual mounting element forming with the second insulating casing a fourth housing in which is intended to be inserted the second portion of the second securing rail disposed in the second relative securing position (P2') of said second securing rail with respect to the second electrical apparatus.

13. The start system according to claim 12, wherein the second individual securing device further comprises a second pressing housing defined between the third individual mounting element and the fourth individual mounting element and forming the second pressing area.

* * * * *